United States Patent
Zhu et al.

(10) Patent No.: US 8,593,227 B2
(45) Date of Patent: Nov. 26, 2013

(54) SYSTEM AND METHOD OF CONTROLLING GAIN OF AN OSCILLATOR

(75) Inventors: Zhi Zhu, San Diego, CA (US); Xiaohua Kong, San Diego, CA (US); Nam Van Dang, San Diego, CA (US); Cheng Zhong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/204,267

(22) Filed: Aug. 5, 2011

(65) Prior Publication Data

US 2013/0033329 A1 Feb. 7, 2013

(51) Int. Cl.
*H03L 7/099* (2006.01)
*H03L 7/10* (2006.01)

(52) U.S. Cl.
USPC ............... 331/16; 331/1 A; 331/34; 331/179

(58) Field of Classification Search
USPC .................. 331/1 A, 16, 17, 11, 34, 14, 179; 327/156
See application file for complete search history.

(56) References Cited

U.S. PATENT DOCUMENTS

| | | | |
|---|---|---|---|
| 5,175,884 A | 12/1992 | Suarez | |
| 7,038,552 B2 | 5/2006 | Brett et al. | |
| 7,233,214 B2 | 6/2007 | Kim et al. | |
| 7,586,379 B2 | 9/2009 | Shimizu | |
| 2005/0073371 A1 | 4/2005 | Brett et al. | |
| 2005/0212611 A1 | 9/2005 | Muthali et al. | |
| 2006/0071723 A1* | 4/2006 | Takeuchi | 331/65 |
| 2010/0134163 A1* | 6/2010 | Kawamoto | 327/157 |
| 2011/0018641 A1 | 1/2011 | Huang et al. | |

FOREIGN PATENT DOCUMENTS

WO 2006072540 A1 7/2006

OTHER PUBLICATIONS

International Search Report and Written Opinion—PCT/US2012/049823—ISA/EPO—Dec. 17, 2012.

* cited by examiner

*Primary Examiner* — Ryan Johnson
(74) *Attorney, Agent, or Firm* — Sam Talpalatsky; Nicholas J. Pauley; Joseph Agusta

(57) ABSTRACT

A circuit includes a controllable oscillator and a controller coupled to the controllable oscillator. The controller is configured to provide a current control and a gain control to the controllable oscillator. The gain control is configured to change a gain of the controllable oscillator during a calibration process.

23 Claims, 6 Drawing Sheets

SYSTEM AND METHOD OF CONTROLLING GAIN OF AN OSCILLATOR

FIELD

The present disclosure is generally related to controlling gain of an oscillator.

DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The circuitry within wireless telephones and other electronic devices may include control systems or circuits such as phase-locked loops (PLLs) that generate an output signal whose phase, frequency, or both is "locked" to an input signal (e.g., a clock signal). For example, a phase-locked output signal may have the same or a multiple of the frequency of the input signal and may be provided as a control signal to other components within a wireless telephone. However, the PLL may be sensitive to process, voltage, and temperature (PVT) variations. To compensate for such PVT variations, an oscillator within the PLL is typically calibrated to a tuning range (e.g., voltage range) such that performance of the oscillator is stable when a tuning signal within the tuning range is applied to the oscillator. However, even when the tuning voltage is within the tuning range, PVT variations may cause significant changes to the frequency-voltage response curve (also referred to as "gain") of the oscillator, which may lead to reduced performance of the PLL.

SUMMARY

The overall performance and reliability of a PLL may be affected by the gain of an oscillator (e.g., a voltage-controlled oscillator (VCO) in the PLL). For example, if the gain of a VCO is too flat (i.e., the frequency range corresponding to the tuning voltage range is small), the VCO may not provide a sufficient frequency coverage margin for use in electronic devices. Conversely, if the gain of the VCO is too steep (i.e., the frequency range corresponding to the tuning voltage range is large), the VCO may experience increased noise and instability.

Systems and methods to control and calibrate the gain of an oscillator, such as an oscillator (e.g., a VCO) within a PLL, are disclosed. A controller or controller circuit may apply a current control and a gain control to calibrate a controllable oscillator (e.g., a VCO). During calibration, the current control may initially be adjusted until a corresponding tuning voltage of the VCO is within a target tuning voltage range. Next, the current control may be maintained while multiple reference voltages (e.g., $V_1$ and $V_2$) are applied to the VCO by a programmable voltage source and corresponding output frequencies (e.g., $F_1$ and $F_2$) are determined. The gain of the VCO may be computed based on the frequency difference (e.g., Gain=$(F_2-F_1)/(V_2-V_1)$). If the computed gain is not equal to or does not approach a target (e.g., desired) gain of the VCO, the gain control may be adjusted to obtain the target gain (obtaining the target value includes a value approaching the target gain). Finally, the gain control (and the target gain) may be maintained while the current control is re-adjusted to bring the tuning voltage of the VCO back within or in the center of the target tuning voltage range.

In a particular embodiment, a circuit includes a controllable oscillator and a controller coupled to the controllable oscillator. The controller is configured to provide a current control and a gain control to the controllable oscillator, where the gain control is configured to change a gain of the controllable oscillator during a calibration process.

In another particular embodiment, a circuit includes a controllable oscillator (e.g., a VCO) and a controller coupled to the controllable oscillator. The controller is configured to provide a current control and a gain control to the controllable oscillator, where the gain control is configured to change a gain of the controllable oscillator. The circuit also includes a programmable reference device coupled to the controllable oscillator. The programmable reference device is configured to apply a reference signal to the controllable oscillator in response to the controller.

In another particular embodiment, a method includes adjusting a current applied to a controllable oscillator so that a tuning signal applied to the controllable oscillator is within a tuning range. The method also includes, while applying the current to the controllable oscillator, applying at least two different reference signals to the controllable oscillator to determine a frequency difference of an output frequency of the controllable oscillator. The method includes further adjusting the current applied to the controllable oscillator in response to the frequency difference.

In another particular embodiment, an apparatus includes a controllable oscillator, means for providing a current control to the controllable oscillator, and means for providing a gain control to the controllable oscillator. The gain control is applied during a calibration process to change a gain of the controllable oscillator.

In another particular embodiment, a non-transitory processor-readable storage medium includes instructions that, when executed by a processor, cause the processor to initiate adjustment of a current applied to a controllable oscillator so that a tuning signal applied to the controllable oscillator is within a tuning range. The instructions are also executable to cause the processor to, while the current is applied to the controllable oscillator, initiate application of at least two different reference signals to the controllable oscillator to determine a frequency difference of an output frequency of the controllable oscillator corresponding to each of the at least two different reference signals. The instructions are executable to cause the processor to initiate further adjustment of the current applied to the controllable oscillator in response to the frequency difference.

One particular advantage provided by at least one of the disclosed embodiments is an ability to calibrate both a tuning voltage and a gain of an oscillator to reduce potential performance degradation caused by process, voltage, and/or temperature variations. Other aspects, advantages, and features of the present disclosure will become apparent after review of the entire application, including the following sections: Brief Description of the Drawings, Detailed Description, and the Claims.

DETAILED DESCRIPTION

Figure 1:
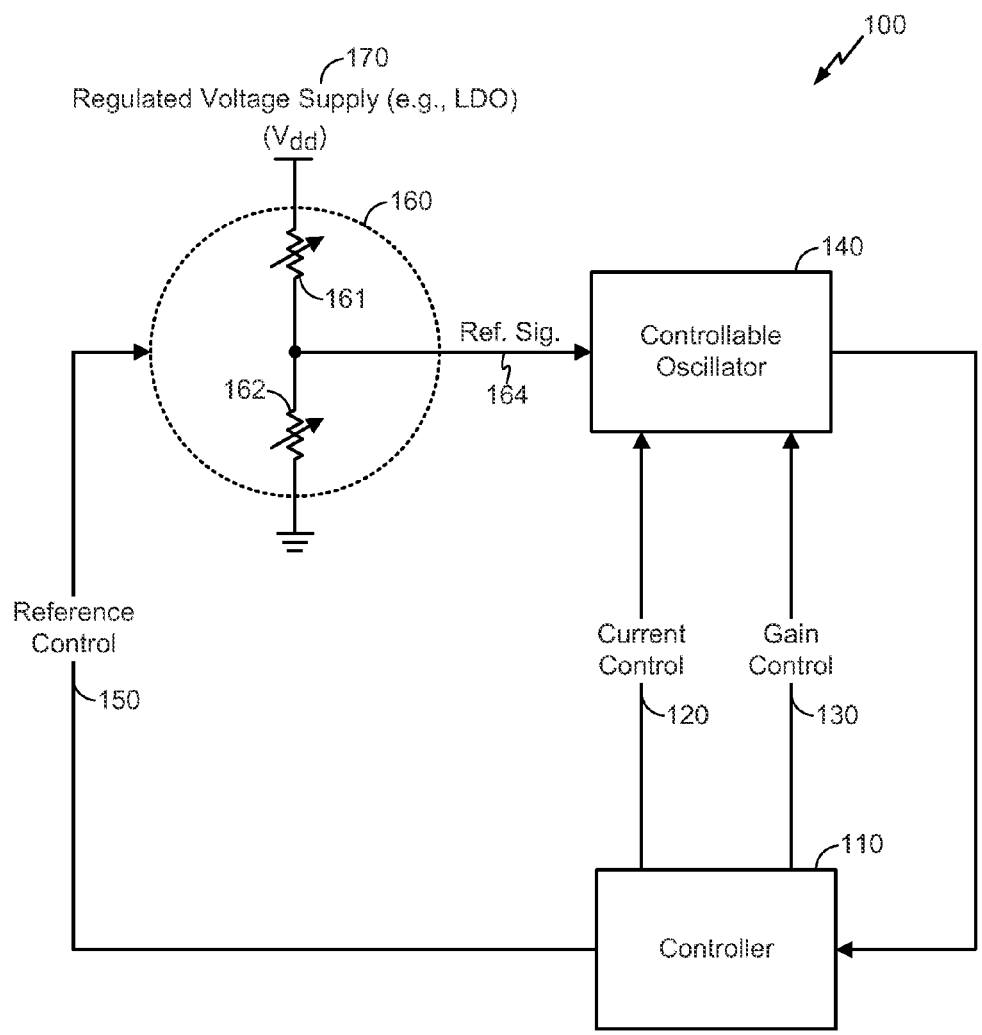
FIG. 1 is a block diagram of a particular illustrative embodiment of a circuit to control an oscillator.

Referring to FIG. 1, a particular illustrative embodiment of a circuit 100 is shown. The circuit 100 includes a controllable oscillator 140 and a controller 110 coupled to the controllable oscillator 140. In a particular embodiment, the controller 110 is configured to provide a current control 120 and a gain control 130 (e.g., a frequency-voltage gain control) to the controllable oscillator 140. The gain control 130 is configured to change a gain of the controllable oscillator 140, such as during a calibration process.

The controller 110 is also configured to provide a reference control 150 to a programmable reference device 160. In a particular illustrative embodiment, the programmable reference device 160 includes a pair of variable resistors (e.g. a first variable resistor 161 and a second variable resistor 162) that may be adjusted via the reference control 150 to adjust a reference signal 164 output of the programmable reference device 160. In another embodiment, the programmable reference device 160 may include more than two variable resistors or may include other components to provide the reference signal 164. The programmable reference device 160 is coupled to ground and is supplied by a regulated voltage supply (designated $V_{dd}$) 170. The regulated voltage supply 170 may be operable to provide relatively accurate and reliable voltage levels. In a particular illustrative embodiment, the regulated voltage supply 170 includes or is coupled to an on-chip low dropout (LDO) regulator.

The reference signal 164 may be generated by the programmable reference device 160 in response to the reference control 150 from the controller 110, and the reference signal 164 may be provided to an input of the controllable oscillator 140. Although a single reference signal 164 is shown for illustrative purposes, it should be understood that multiple reference signals may be provided by the programmable reference device 160 to the controllable oscillator 140. In a particular embodiment, the reference signal 164 is a programmable voltage or current. For example, a reference voltage may be generated at a node between the first variable resistor 161 and the second variable resistor 162 (e.g., based on a ratio of a first resistance provided by the first variable resistor 161 and a second resistance provided by the second variable resistor 162).

During operation, the controller 110 may adjust one or more of the current control 120, the gain control 130, and the reference control 150 (which in turn adjusts the reference signal 164) to calibrate a frequency-voltage curve (i.e., gain) and tuning range of the controllable oscillator 140. For example, a frequency output of the controllable oscillator 140 may be responsive to and adjusted by the current control 120. The current control 120 may be adjusted such that a target output frequency (e.g., a center of the frequency-voltage curve) is achieved at a target tuning voltage (e.g., a center of a target tuning voltage range), as further illustrated with reference to FIG. 2.

As another example, the gain control 130 may be operable to inject (e.g., as a current source) current into or remove (e.g., as a current sink) current from the controllable oscillator 140, or a circuit therein or coupled thereto, to adjust the gain of the controllable oscillator 140. Thus, a gain of the controllable oscillator 140 may be adjusted by the gain control 130 in response to logic within the controller 110. In a particular embodiment, the gain control 130 may adjust a slope of the frequency-voltage curve of the controllable oscillator 140, as further illustrated with reference to FIG. 2.

In a particular embodiment, the controller 110 may adjust the gain control 130 responsive to output frequency differences of an output of the controllable oscillator 140 responsive to changes to the reference signal 164. To illustrate, the controller 110 may selectively program or control the programmable reference device 160 via the reference control 150 to generate multiple different values (e.g., voltage levels) of the reference signal 164 and may measure a corresponding output frequency of the controllable oscillator 140 at each of the different values of the reference signal 164. Alternately, when the controllable oscillator is a current-controlled oscillator, the reference signal 164 may be a programmable reference current. Based on a difference between the multiple detected output frequencies, the controller 110 may determine a gain of the controllable oscillator 140. If the gain is not equal to or sufficiently approaching or close to a target gain, the controller 110 may adjust the gain control 130 accordingly (and may verify that the post-adjustment gain is equal to or sufficiently approaching or close to the target gain by repeating the gain determination process using different values of the reference signal 164). An illustrative method of calibrating the gain of a controllable oscillator is further described with reference to FIG. 4.

The circuit 100 of FIG. 1 may thus calibrate the gain and the tuning voltage of the controllable oscillator 140 to reduce potential performance degradation caused by process, voltage, and/or temperature variations. For example, the circuit 100 of FIG. 1 may increase a frequency coverage range of the controllable oscillator 140 which would otherwise be reduced as the gain of the controllable oscillator 140 becomes too flat due to environmental conditions. As another example, the circuit 100 of FIG. 1 may decrease noise and instability which would otherwise result as the gain of the controllable oscillator 140 becomes too steep due to environmental conditions.

Figure 2:
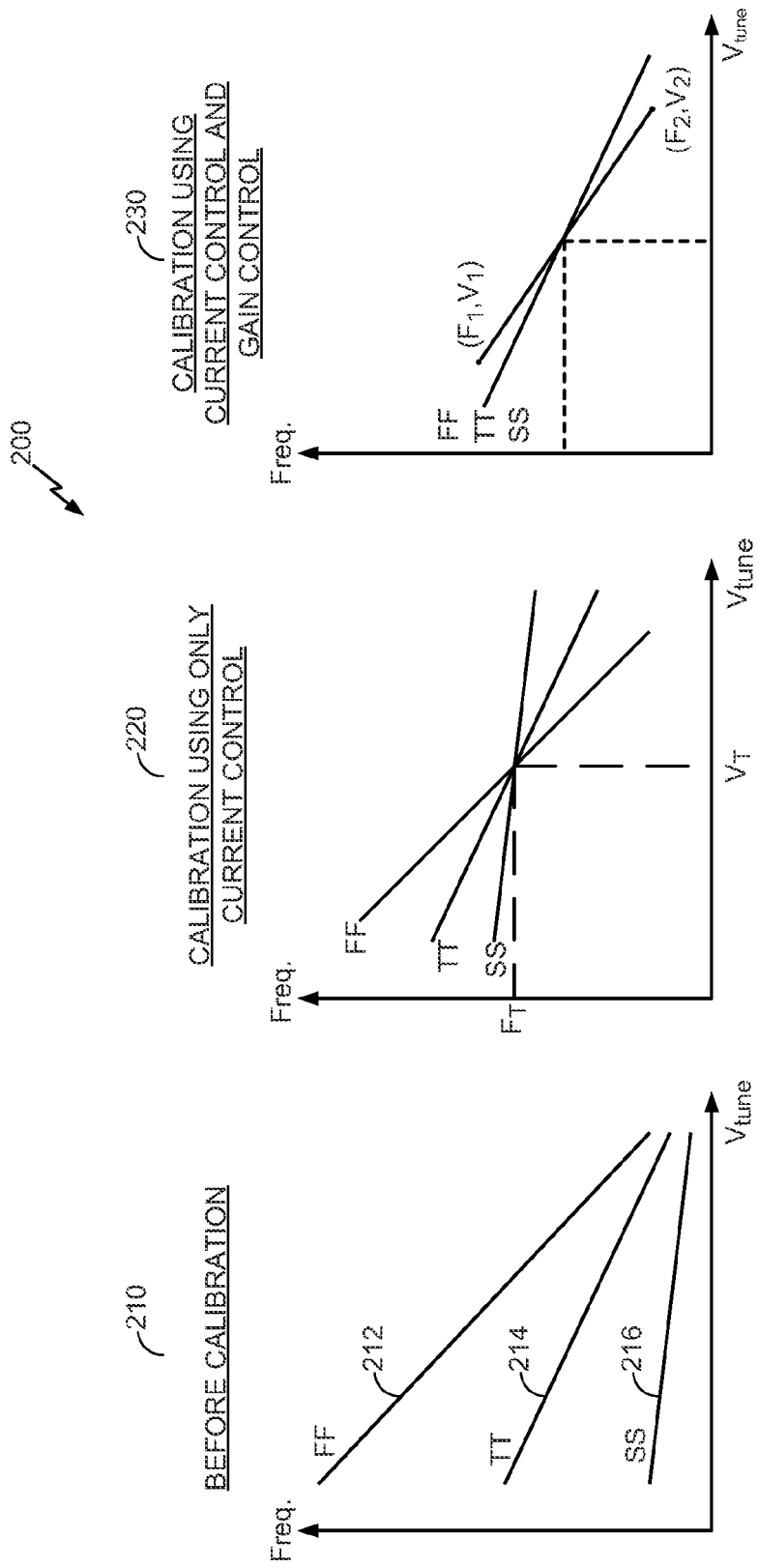
FIG. 2 is a set of diagrams to illustrate results of performing calibration operations on the controllable oscillator of FIG. 1.

Referring to FIG. 2, a set of diagrams 200 illustrates results of performing a calibration process (e.g., the calibration process described with reference to FIG. 4) on a controllable oscillator. The set of diagrams 200 includes a first diagram 210, a second diagram 220, and a third diagram 230. In an illustrative embodiment, each of the diagrams 210, 220, and 230 may represent frequency-voltage curves of the controllable oscillator 140 of FIG. 1.

The first diagram 210 illustrates frequency versus tuning voltage performance of a controllable oscillator before calibration is performed. As shown in FIG. 2, the gain of the controllable oscillator (i.e., the slopes of the curves) may vary significantly with process, voltage, and temperature variations. Three exemplary curves 212, 214, and 216, designated fast-fast (FF, corresponding to fast process, high voltage, and/or high temperature), typical-typical (TT, corresponding to typical process, typical voltage, and/or typical temperature), and slow-slow (SS, corresponding to slow process, low voltage, and/or low temperature) are shown.

A phase-locked loop (PLL) that relies on the controllable oscillator may not be able to reach or maintain lock in SS conditions due to the low frequency coverage range of the SS curve 216. In addition, due to the low frequency coverage range of the SS curve 216, the controllable oscillator may not be programmable over an entirety of a target frequency range. As another example, while the FF curve 212 has a greater frequency range than the SS curve 216 or the TT curve 214, the FF curve 212 may have a greater degree of noise, which may impact the design or performance of the controllable oscillator. Thus, due to variations in device characteristics or environment, operation of the uncalibrated controllable oscillator, as shown by the first diagram 210, may vary greatly and cause difficulties in design for different implementations.

The second diagram 220 illustrates frequency versus voltage performance for different devices after calibration is performed using only current control (e.g., via the current control 120 of FIG. 1) but not using gain control (e.g., via the gain control 130 of FIG. 1). As shown in FIG. 2, calibration using current control may "vertically shift" the curves, so that regardless of whether the oscillator is experiencing FF, TT, or SS conditions, the oscillator outputs a target frequency $F_T$ (typically located in the center of a target frequency range) at a target tuning voltage $V_T$ (typically located in the center of a target tuning voltage range). However, as will be appreciated from the second diagram 220, the FF, TT, and SS curves may still have significantly different slopes, which may result in reduced frequency coverage range when the curve is too flat or noise and instability when the curve is too steep. Thus, even though calibration is performed using a current control, performance of the oscillator may degrade in response to PVT variations.

The third diagram 230 illustrates frequency versus tuning voltage performance for a controllable oscillator where calibration is performed using both current control and gain control. In a particular embodiment, prior to adjusting the gain control (e.g., the gain control 130), a controller (e.g., the controller 110 of FIG. 1) may apply two different reference signals representing voltage levels $V_1$ and $V_2$ and determine two different corresponding output frequencies $F_1$ and $F_2$, as illustrated in the third diagram 230. Based on the difference in output frequencies, the controller may determine the pre-calibration gain (i.e., a slope of a line including the points ($V_1$, $F_1$) and ($V_2$, $F_2$)) of the controllable oscillator. If the determined gain is not equal to or sufficiently close to a target gain, the gain control may be adjusted, such that the SS, TT, and FF curves 212-216 become substantially collinear at a desired gain, as illustrated in the third diagram 230. Thus, the calibrated controllable oscillator may have improved operating characteristics (e.g., frequency range and noise suppression) for a variety of device types, temperatures, voltages, and other environmental factors. For example, a circuit designer may adjust the frequency range versus noise depending on a particular application, and the range of frequency versus noise may be kept within a managed amount of variability providing improved design robustness.

Figure 3:
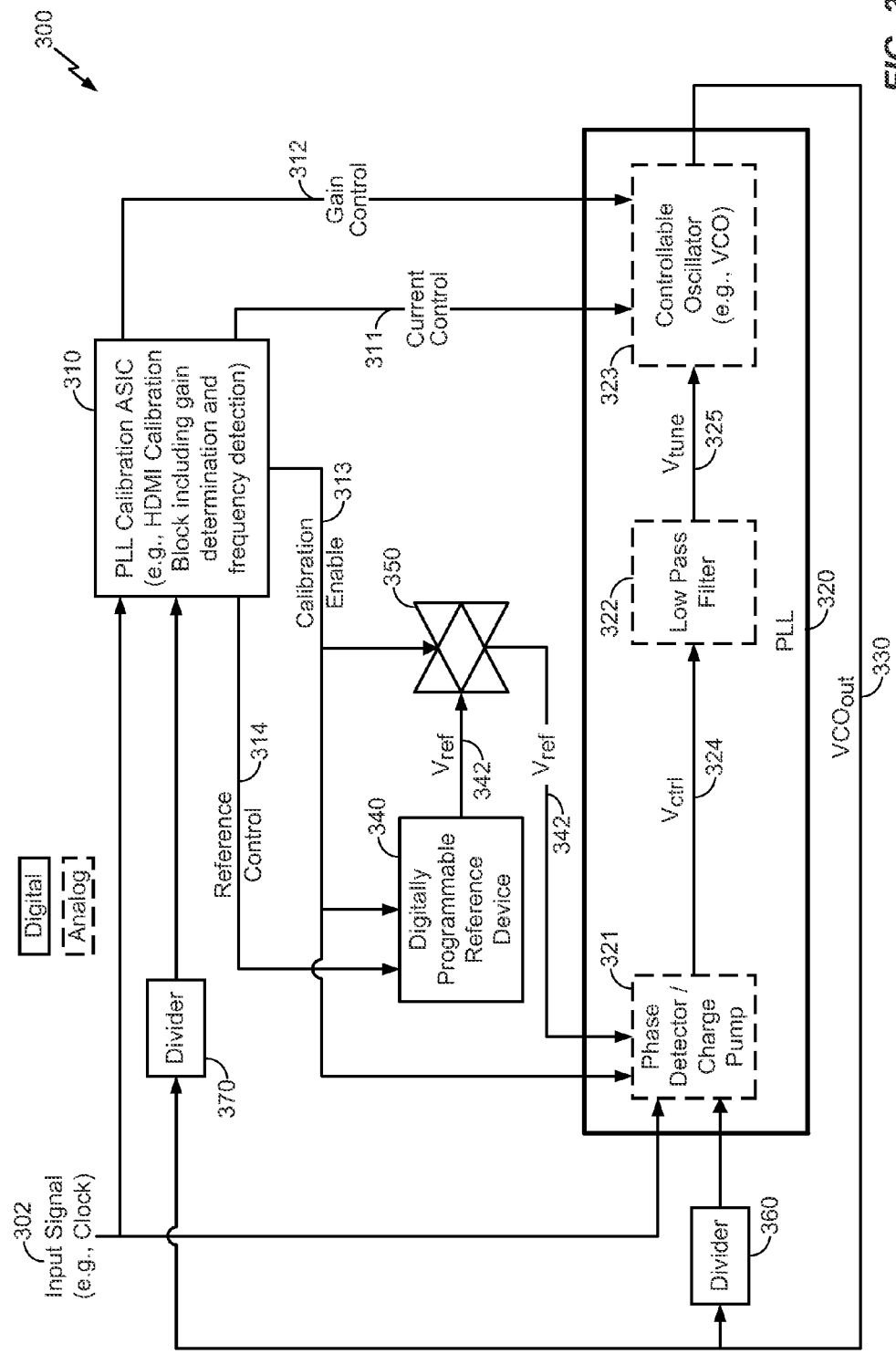
FIG. 3 is a block diagram of a particular illustrative embodiment of a system operable to control gain of an oscillator.

Referring to FIG. 3, a particular illustrative embodiment of a system 300 is shown. The system 300 includes a PLL calibration unit 310, implemented as an application specific integrated circuit (ASIC), and a phase-locked loop (PLL) 320. In alternate embodiments, one or more functions of the PLL calibration unit 310 may be implemented using instructions executed by a processor instead of using dedicated hardware such as an ASIC or controller.

The system 300 further includes a digitally programmable reference device 340. The PLL 320 includes a phase detector/charge pump 321, a low pass filter 322, and a controllable oscillator 323. In a particular embodiment, the controllable oscillator 323 is a voltage-controlled oscillator (VCO). The system 300 further includes a pass gate 350, a first divider 360, and a second divider 370. In a particular embodiment, the PLL calibration unit 310 may be integrated into a calibration block of an electronic device, such as a high-definition multimedia interface (HDMI) calibration block, a radio frequency (RF) interface calibration block, or some other signal calibration or signal processing block, module, or circuit. In addition, the PLL calibration unit 310 may include gain determination logic and a frequency detection capability. In an illustrative embodiment, the PLL calibration unit 310 may correspond to the controller 110 of FIG. 1. The controllable oscillator 323 may correspond to the controllable oscillator 140 of FIG. 1 and the digitally programmable reference device 340 may correspond to the programmable reference device 160 of FIG. 1.

The PLL calibration unit 310 is operable to generate a calibration enable signal 313, a current control signal 311, a gain control signal 312, and a reference control signal 314. The PLL calibration unit 310 has a first input that is responsive to an input signal 302 and has a second input that is responsive to the second divider 370, which is coupled to an output 330 of the PLL 320. The first divider 360 is also coupled to the output 330 of the PLL 320, and the first divider 360 provides an output which is received at a second input (e.g., a feedback input) of the PLL 320. A first input of the PLL 320 receives the input signal 302. The first and second inputs of the PLL 320 are coupled to the phase detector/charge pump 321 of the PLL 320. Another input of the phase detector/charge pump 321 receives the calibration enable signal 313 generated by the PLL calibration unit 310. The phase detector/charge pump 321 outputs a control voltage $V_{ctrl}$ 324 to the low pass filter 322, which in turn outputs a tuning voltage $V_{tune}$ 325 to a first input of the controllable oscillator 323. The controllable oscillator 323 of the PLL 320 also has second and third inputs that are responsive to the current control 311 and to the gain control 312, respectively.

As illustrated in FIG. 3, the system 300 includes both digital components and analog circuit components. For example, the phase detector/charge pump 321, the low pass filter 322, and the controllable oscillator 323 may be implemented as analog components, while the other components of the system 300 may be digital components that enable digital gain calibration of the analog PLL 320.

In a particular illustrative embodiment, the gain control 312 is a frequency-voltage gain control that adjusts the gain of the controllable oscillator 323 of the PLL 320. In addition, the digitally programmable reference device 340 may produce a reference voltage $V_{ref}$ 342 that is provided via the pass gate 350, when the calibration enable signal 313 is asserted, to the PLL 320.

The system 300 of FIG. 3 may be operable in two modes: a calibration mode and a closed-loop mode. In a particular embodiment, the system 300 may automatically operate in the calibration mode during or responsive to a power-on event, a startup event, or other event of the system 300. During the calibration mode, the PLL calibration unit 310 may assert the calibration enable signal 313 and adjust the current control signal 311, the gain control signal 312, and the reference control signal 314 to calibrate the tuning voltage $V_{tune}$ 325 and the gain of the controllable oscillator 323, as described with reference to the controller 110 of FIG. 1.

For example, the PLL calibration unit 310 may initially adjust the current control signal 311 so that a target value of the tuning voltage $V_{tune}$ 325 is in the center of a target tuning voltage range and the corresponding output frequency of the PLL (measured at the PLL output 330 and/or at the output of the second divider 370) is in a center of a target frequency range. In an illustrative embodiment, the target tuning voltage and output frequency values may be the values $V_T$ and $F_T$ of FIG. 2 and the initial adjustment of the current control signal 311 may result in a system state corresponding to the second diagram 220 of FIG. 2.

Next, the PLL calibration unit 310 may vary the reference control signal 314 to generate at least two different values of the reference voltage $V_{ref}$ 342. In a particular embodiment, the different values of the reference voltage $V_{ref}$ 342 are generated using an internal, regulated voltage supply for accuracy, such as an on-chip low dropout (LDO) regulator. The PLL calibration unit 310 may determine corresponding output frequencies of the PLL for each different value of $V_{ref}$ 342 while the current control signal 311 is kept constant. Based on differences between the output frequencies, the PLL calibration unit 310 may compute a gain of the controllable oscillator 323 and may compare the computed gain to a target (e.g., desired) gain. If the computed gain is different from the target gain, the PLL calibration unit 310 may adjust the gain control 312 so that the gain of the controllable oscillator 323 becomes substantially equal to the target gain. The PLL calibration unit 310 may also verify that the post-adjustment gain is equal to or sufficiently close to the target gain by repeating the gain determination process using different values of the reference signal $V_{ref}$ 342.

Finally, the PLL calibration unit 310 may readjust the current control signal 311 while keeping the gain control signal 312 constant. Readjustment of the current control signal 311 may be useful to recenter the target tuning voltage and output frequency (e.g., $V_T$ and $F_T$) within their respective target ranges. Readjusting the current control signal 311 may calibrate the controllable oscillator 323 to a particular frequency-voltage tuning range, after which the PLL calibration unit 310 may de-assert the calibration enable signal 313 and switch the system 320 into the closed-loop operating mode.

During the closed-loop operating mode, both the current control signal 311 and the gain control signal 312 may be maintained at the levels determined during the calibration mode, and the PLL 320 may achieve lock between the PLL output 330 and the input signal 302. It should be noted that lock may be achieved at multiple frequencies. For example, in accordance with an HDMI standard, the PLL output 330 may be generated at various frequencies corresponding to various permitted HDMI pixel clock rates, video refresh rates, and/or audio bitrates in the range of 60 Hz to 340 MHz.

It will be appreciated that since the PLL calibration unit 310 and the digitally programmable reference device 340 may be implemented using digital technology, performance of the PLL calibration unit 310 may be more repeatable than use of analog or mixed-signal components. In this manner, a controller or ASIC, such as the controller 110 of FIG. 1 or the PLL calibration unit 310 of FIG. 3, may be implemented using digital logic and/or microprocessor(s) to repeatedly and consistently calibrate the controllable oscillator 140 of FIG. 1 and the controllable oscillator 323 of FIG. 3.

Figure 4:
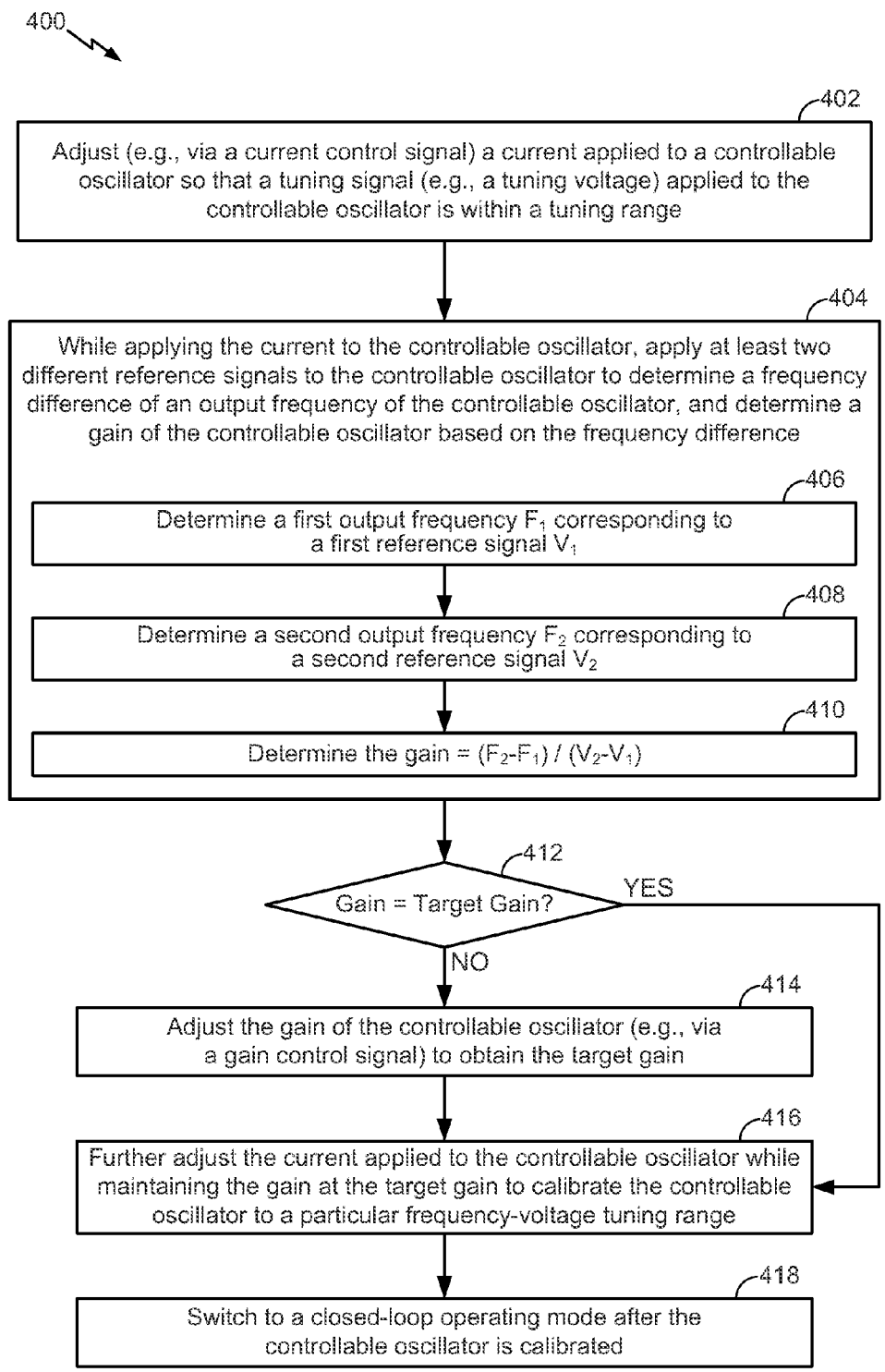
FIG. 4 is a flowchart to illustrate a particular embodiment of a method of controlling gain of an oscillator.

Referring to FIG. 4, a particular illustrative embodiment of a method 400 of calibrating a controllable oscillator is shown.

In an illustrative embodiment, the method 400 may be performed by the circuit 100 of FIG. 1 or by the system 300 of FIG. 3.

The method 400 includes adjusting a current applied to a controllable oscillator so that a tuning signal (e.g., a tuning voltage) applied to the controllable oscillator is within a tuning range, at 402. For example, in FIG. 1, the controller 110 may adjust current applied to the controllable oscillator 140 by use of the current control signal 120. As another example, in FIG. 3, the PLL calibration unit 310 may adjust current applied to the controllable oscillator 323 via the current control signal 311.

The method 400 also includes, while applying the current to the controllable oscillator, applying at least two different reference signals to the controllable oscillator to determine a frequency difference of an output frequency of the controllable oscillator, and determining a gain of the controllable oscillator based on the frequency difference, at 404. In a particular embodiment, determining the gain may include determining a first output frequency $F_1$ corresponding to a first reference voltage signal $V_1$, at 406, and determining a second output frequency $F_2$ corresponding to a second reference signal $V_2$, at 408. The gain may be determined, at 410, by computing a result of the formula $(F_2-F_1)/(V_2-V_1)$, as shown. For example, in FIG. 1, two different values of the reference signal 164 may be applied to the controllable oscillator 140, and the controller 110 may determine the gain of the controllable oscillator based on a difference in output frequencies of the controllable oscillator 140. As another example, in FIG. 3, two different values of the reference voltage $V_{ref}$ 342 may be applied to the controllable oscillator 323, and the PLL calibration unit 310 may determine the gain of the controllable oscillator 323 based on a difference in output frequencies of the controllable oscillator 323.

It should be noted that while the method 400 describes use of two different frequencies and two different reference voltages, more than two frequencies and more than two corresponding reference voltages may be used to compute gain.

The method 400 further includes determining whether the computed gain is equal or substantially equal to a target gain, at 412. If the computed gain is not equal or substantially equal to the target gain, then the method 400 proceeds to 414 and includes adjusting the gain of the controllable oscillator (e.g., via a gain control signal) to obtain the target gain. For example, in FIG. 1, the controller 110 may adjust the gain control 130 to obtain the target gain. As another example, in FIG. 3, the PLL calibration unit 310 may adjust the gain control signal 312 to obtain the target gain. The method 400 then proceeds to 416. Alternately, if the computed gain is equal to or substantially equal to the target gain, at 412, then the method 400 advances from 412 to 416 without adjusting the gain at 414.

At 416, the method 400 includes further adjusting the current applied to the controllable oscillator, while maintaining the gain at the target gain, in order to calibrate the controllable oscillator to a particular frequency-voltage tuning range. For example, in FIG. 1, the controller 110 may further adjust the current control 120 while keeping the gain control 130 constant or substantially constant. As another example, in FIG. 3, the PLL calibration unit 310 may adjust the current control signal 311 while keeping the gain control signal 312 constant or substantially constant.

The method 400 also includes switching to a closed-loop operating mode after the controllable oscillator is calibrated, at 418. For example, the controllable oscillator 140 of FIG. 1 or the controllable oscillator 323 of FIG. 3 may be switched to a closed-loop operating mode after the calibration based on the current control and the gain control is completed.

The method 400 of FIG. 4 may thus enable calibrating the gain of a controllable oscillator (e.g., a VCO) to reduce undesirable effects of process, voltage, and/or temperature variations. Moreover, the method 400 of FIG. 4 may be used in connection with a standalone controllable oscillator or a controllable oscillator that is integrated into an electrical device or component, such as the PLL 320 of FIG. 3.

In a particular embodiment, the method 400 of FIG. 4 may be implemented by an application-specific integrated circuit (ASIC), a processing unit such as a central processing unit (CPU) executing instructions, a controller, another hardware device, a firmware device, or any combination thereof.

Figure 5:
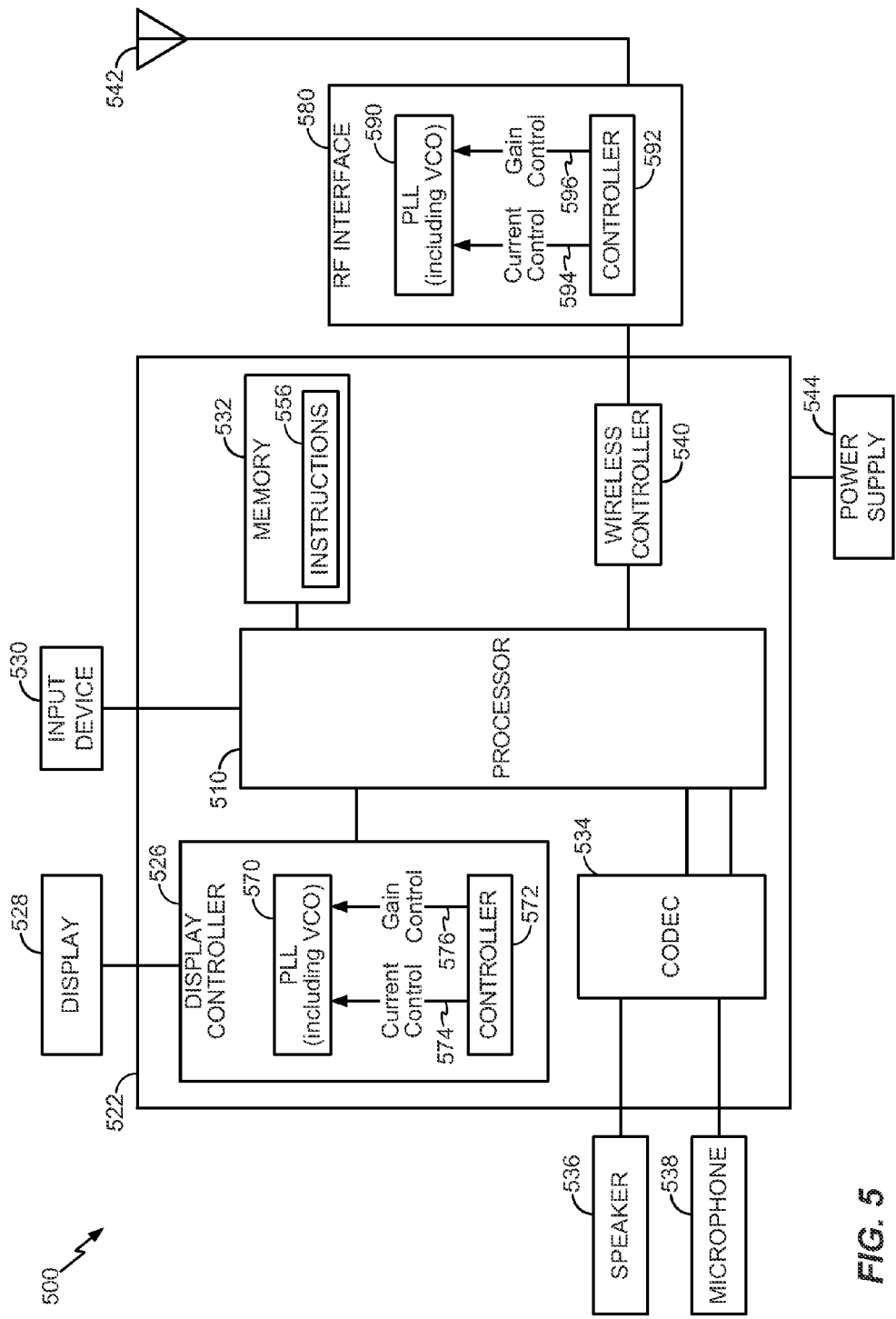
FIG. 5 is a block diagram of a wireless device including multiple systems operable to control gain of an oscillator.

Referring to FIG. 5, a block diagram of a particular illustrative embodiment of a wireless communication device is depicted and generally designated 500. The device 500 includes a processor, such as a digital signal processor (DSP) 510, coupled to a memory 532.

FIG. 5 also shows a display controller 526 that is coupled to the digital signal processor 510 and to a display 528. The display controller may include a phase-locked loop (PLL) 570 coupled to a controller 572. In an illustrative embodiment, the PLL 570 may include a controllable oscillator, such as the controllable oscillator 140 of FIG. 1 or the controllable oscillator 323 of FIG. 3, and the controller 572 may be the controller 110 of FIG. 1 or the PLL calibration unit 310 of FIG. 3. The controller 572 may apply a current control 574 and a gain control 576 to the PLL 570, as described with reference to the current control 120 and the gain control 130 of FIG. 1, and the current control 311 and the gain control 312 of FIG. 3. In a particular embodiment, the controller 572 may perform the method 400 of FIG. 4.

A coder/decoder (CODEC) 534 can also be coupled to the digital signal processor 510. A speaker 536 and a microphone 538 can be coupled to the CODEC 534. FIG. 5 also indicates that a wireless controller 540 can be coupled to the digital signal processor 510 and to a wireless antenna 542. In a particular embodiment, a radio frequency (RF) interface 580 disposed between the wireless controller 540 and the wireless antenna 542 includes a PLL 590 coupled to a controller 592. In an illustrative embodiment, the PLL 590 may include a controllable oscillator, such as the controllable oscillator 140 of FIG. 1 or the controllable oscillator 323 of FIG. 3, and the controller 592 may be the controller 110 of FIG. 1 or the PLL calibration unit 310 of FIG. 3. The controller 592 may apply a current control 594 and a gain control 596 to the PLL 590, as described with reference to the current control 120 and the gain control 130 of FIG. 1 and the current control 311 and the gain control 312 of FIG. 3. In a particular embodiment, the controller 592 may perform the method 400 of FIG. 4.

The memory 532 may be a tangible non-transitory processor-readable storage medium that includes executable instructions 556. The instructions 556 may be executed by a processor, such as the processor 510 or a processor within the controllers 572, 592 to initiate (e.g., via the current controls 574, 594) adjustment of a current applied to a controllable oscillator (e.g., a VCO within the PLLs 570, 590) so that a tuning signal applied to the controllable oscillator is within a tuning range. The instructions 556 may also be executable to initiate application of at least two reference signals to the controllable oscillator to determine a frequency difference of an output of the controllable oscillator while the current is applied to the controllable oscillator. The instructions 556 may further be executable to determine a gain of the controllable oscillator based on the frequency difference. When the gain of the controllable oscillator is different from a target gain, the processor may initiate application of a gain control signal (e.g., the gain control 576, 596) to the controllable oscillator to adjust the gain of the controllable oscillator to the target gain.

The instructions 556 may be executable to initiate further adjustment of the current applied to the controllable oscillator in response to the frequency difference. The current may be further adjusted while maintaining the gain of the controllable oscillator at the target gain, and further adjusting the current may calibrate the controllable oscillator to a particular frequency-voltage tuning range. After the controllable oscillator is calibrated, the instructions 556 may be executable to initiate a closed loop operating mode.

In a particular embodiment, the DSP 510, the display controller 526, the memory 532, the CODEC 534, and the wireless controller 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the wireless antenna 542, and the power supply 544 are external to the system-on-chip device 522. However, each of the display 528, the input device 530, the speaker 536, the microphone 538, the wireless antenna 542, and the power supply 544 can be coupled to a component of the system-on-chip device 522, such as an interface or a controller.

In conjunction with the described embodiments, an apparatus is disclosed that includes a controllable oscillator and means for providing a current control to the controllable oscillator. For example, the means for providing the current control may include the controller 110 of FIG. 1, the PLL calibration unit 310 of FIG. 3, the controller 572 of FIG. 5, the controller 592 of FIG. 5, the processor 510 of FIG. 5, the instructions 556 of FIG. 5, one or more other devices, circuits, modules, or instructions to provide a current control to a controllable oscillator, or any combination thereof.

The apparatus may also include means for providing a gain control to the controllable oscillator, where the gain control is configured to change a gain of the controllable oscillator during a calibration process. For example, the means for providing the gain control may include the controller 110 of FIG. 1, the PLL calibration unit 310 of FIG. 3, the controller 572 of FIG. 5, the controller 592 of FIG. 5, the processor 510 of FIG. 5, the instructions 556 of FIG. 5, one or more other devices, circuits, modules, or instructions to provide a gain control to a controllable oscillator, or any combination thereof.

The apparatus may further include means for applying a programmable reference signal to the controllable oscillator. For example, the means for applying the programmable reference signal may include the controller 110 of FIG. 1, the programmable reference device 160 of FIG. 1, the PLL calibration unit 310 of FIG. 3, the digitally programmable reference device 340 of FIG. 3, the pass gate 350 of FIG. 3, the controller 572 of FIG. 5, the controller 592 of FIG. 5, the processor 510 of FIG. 5, the instructions 556 of FIG. 5, one or more other devices, circuits, modules, or instructions to apply a programmable reference signal, or any combination thereof.

The apparatus may also include means for determining a gain of the controllable oscillator in response to application of multiple reference signals to the controllable oscillator. For example, the means for determining the gain may include the controller 110 of FIG. 1, the programmable reference device 160 of FIG. 1, the PLL calibration unit 310 of FIG. 3, the digitally programmable reference device 340 of FIG. 3, the pass gate 350 of FIG. 3, the controller 572 of FIG. 5, the controller 592 of FIG. 5, the processor 510 of FIG. 5, the instructions 556 of FIG. 5, one or more other devices, circuits, modules, or instructions to determine a gain of a controllable oscillator, or any combination thereof.

Figure 6:
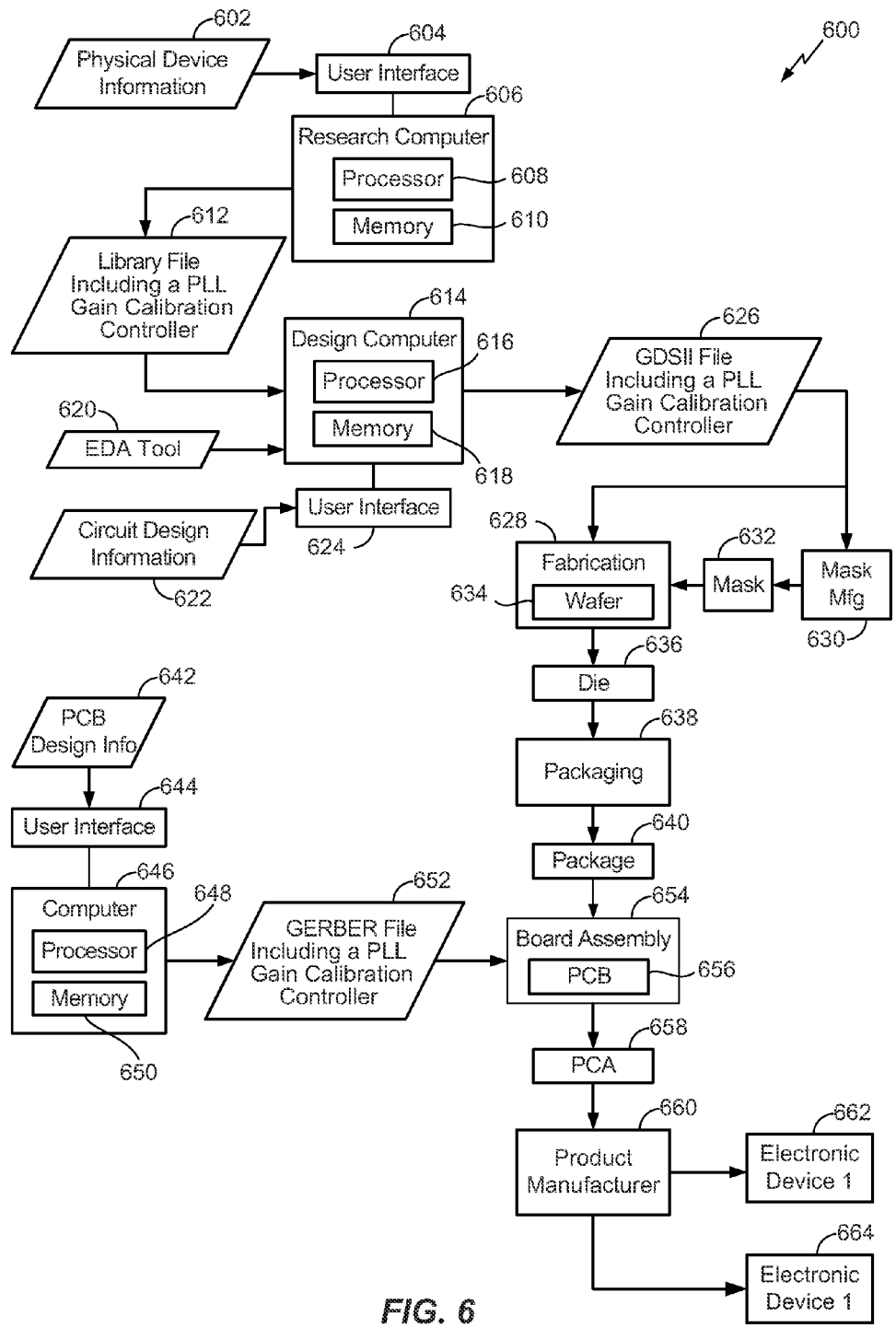
FIG. 6 is a data flow diagram of a particular illustrative embodiment of a manufacturing process to manufacture electronic devices that include a system operable to control gain of an oscillator.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 6 depicts a particular illustrative embodiment of an electronic device manufacturing process 600.

Physical device information 602 is received at the manufacturing process 600, such as at a research computer 606. The physical device information 602 may include design information representing at least one physical property of a semiconductor device, such as the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including a device that includes the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof, of the library file 612. For example, a user of the design computer 614 may enter circuit design information 622 via a user interface 624 coupled to the design computer 614. The circuit design information 622 may include design information representing at least one physical property of a semiconductor device, such as the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof, in addition to other circuits or information. To illustrate, the data file may include information corresponding to a system-on-chip (SOC) that includes the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof, and that also includes additional electronic circuits and components within the SOC.

The GDSII file 626 may be received at a fabrication process 628 to manufacture the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 634, which may be tested and separated into dies, such as a representative die 636. The die 636 includes a circuit including a device that includes the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a set top box, a music player, a video player, an entertainment unit, a navigation device, a communications device, a personal digital assistant (PDA), a fixed location data unit, and a computer, into which the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof is integrated. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 6 illustrates remote units according to teachings of the disclosure, the disclosure is not limited to these illustrated units. Embodiments of the disclosure may be suitably employed in any device which includes active integrated circuitry including memory and on-chip circuitry.

A device that includes the controller 110 of FIG. 1, the controllable oscillator 140 of FIG. 1, the programmable reference device 160 of FIG. 1, the PLL calibration unit 310 of FIG. 3, the PLL 320 of FIG. 3 or components thereof, the digitally programmable reference device 340 of FIG. 3, the pass gate 350 of FIG. 3, the dividers 360 or 370 of FIG. 3, the PLLs 570 or 590 of FIG. 5, the controllers 572 or 592 of FIG. 5, or any combination thereof, may be fabricated, processed, and incorporated into an electronic device, as described in the illustrative process 600. One or more aspects of the embodiments disclosed with respect to FIGS. 1-5 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit, comprising:
a controllable oscillator; and
a controller coupled to the controllable oscillator, wherein the controller is configured to provide a current control and a gain control to the controllable oscillator, wherein during a calibration process, the controller is configured to:
adjust a current applied to the controllable oscillator so that a tuning signal applied to the controllable oscillator is within a tuning range;
while applying the current to the controllable oscillator, apply at least two different reference signals to the controllable oscillator to determine a frequency difference of an output frequency of the controllable oscillator;
further adjust the current applied to the controllable oscillator in response to the frequency difference;
determine a gain of the controllable oscillator based on the frequency difference and a corresponding difference in the at least two different reference signals;
adjust the gain of the controllable oscillator to a target gain; and
further adjust the current while substantially maintaining the gain of the controllable oscillator at the target gain to calibrate the controllable oscillator to a particular frequency-voltage tuning range.

2. The circuit of claim 1, wherein the controllable oscillator is a voltage-controlled oscillator (VCO) and wherein the gain control is a frequency-voltage gain control that adjusts the gain of the VCO.

3. The circuit of claim 1, further comprising a programmable reference device configured to apply a programmable reference voltage to the controllable oscillator, wherein the programmable reference voltage is determined based on a reference control provided by the controller to the programmable reference device.

4. The circuit of claim 1, further comprising at least one of: a set top box, a music player, a video player, an entertainment unit, a navigation device, a communications device, a personal digital assistant (PDA), a fixed location data unit, or a computer, into which the controller is integrated.

5. A circuit, comprising:
a controllable oscillator;
a controller coupled to the controllable oscillator, wherein the controller is configured to provide a current control and a gain control to the controllable oscillator, wherein during a calibration process, the controller is configured to:
adjust a current applied to the controllable oscillator so that a tuning signal applied to the controllable oscillator is within a tuning range;
while applying the current to the controllable oscillator, apply at least two different reference signals to the controllable oscillator to determine a frequency difference of an output frequency of the controllable oscillator;
further adjust the current applied to the controllable oscillator in response to the frequency difference;
determine a gain of the controllable oscillator based on the frequency difference and a corresponding difference in the at least two different reference signals;
adjust the gain of the controllable oscillator to a target gain;
further adjust the current while substantially maintaining the gain of the controllable oscillator at the target gain to calibrate the controllable oscillator to a particular frequency-voltage tuning range; and
a programmable reference device coupled to the controllable oscillator, wherein the programmable reference device is configured to apply a reference signal to the controllable oscillator in response to the controller.

6. The circuit of claim 5, wherein the reference signal is a programmable reference current.

7. The circuit of claim 5, wherein the reference signal is a programmable reference voltage and wherein the controllable oscillator is a voltage-controlled oscillator (VCO).

8. The circuit of claim 5, wherein the controller is further configured to determine the gain based on multiple detected frequencies of the controllable oscillator in response to multiple reference signals applied to the controllable oscillator by the programmable reference device.

9. The circuit of claim 5, further comprising a regulated voltage supply coupled to the programmable reference device.

10. The circuit of claim 5, wherein the controller is an application-specific integrated circuit (ASIC).

11. The circuit of claim 5, further comprising at least one of: a set top box, a music player, a video player, an entertainment unit, a navigation device, a communications device, a personal digital assistant (PDA), a fixed location data unit, or a computer, into which the controller is integrated.

12. A method of controlling an oscillator, the method comprising: during a calibration process:
adjusting a current applied to a controllable oscillator so that a tuning signal applied to the controllable oscillator is within a tuning range;
while applying the current to the controllable oscillator, applying at least two different reference signals to the controllable oscillator to determine a frequency difference of an output frequency of the controllable oscillator;
further adjusting the current applied to the controllable oscillator in response to the frequency difference;
determining a gain of the controllable oscillator based on the frequency difference and a corresponding difference in the at least two different reference signals;
adjusting the gain of the controllable oscillator to a target gain; and
further adjusting the current while substantially maintaining the gain of the controllable oscillator at the target gain to calibrate the controllable oscillator to a particular frequency-voltage tuning range.

13. The method of claim 12, wherein the at least two different reference signals are generated by a programmable reference device coupled to an on-chip low dropout regulator and to the controllable oscillator.

14. The method of claim 13, wherein the programmable reference device comprises a pair of variable resistances.

15. The method of claim 12, further comprising switching to a closed-loop operating mode after the controllable oscillator is calibrated.

16. The method of claim 12, wherein the calibration process is performed by a controller integrated into at least one of: a set top box, a music player, a video player, an entertainment unit, a navigation device, a communications device, a personal digital assistant (PDA), a fixed location data unit, or a computer.

17. An apparatus, comprising:
a controllable oscillator;
means for providing a current control and a gain control to the controllable oscillator, wherein during a calibration process, the means for providing a current control and again control is configured to:
adjust a current applied to the controllable oscillator so that a tuning signal applied to the controllable oscillator is within a tuning range;
while applying the current to the controllable oscillator, apply at least two different reference signals to the controllable oscillator to determine a frequency difference of an output frequency of the controllable oscillator;
further adjust the current applied to the controllable oscillator in response to the frequency difference;
determine a gain of the controllable oscillator based on the frequency difference and a corresponding difference in the at least two different reference signals;
adjust the gain of the controllable oscillator to a target gain; and
further adjust the current while substantially maintaining the gain of the controllable oscillator at the target gain to calibrate the controllable oscillator to a particular frequency-voltage tuning range.

18. The apparatus of claim 17, further comprising means for applying a programmable reference signal to the controllable oscillator.

19. The apparatus of claim 18, further comprising means for determining a gain of the controllable oscillator in response to application of multiple reference signals to the controllable oscillator.

20. The apparatus of claim 17, further comprising at least one of: a set top box, a music player, a video player, an entertainment unit, a navigation device, a communications device, a personal digital assistant (PDA), a fixed location data unit, or a computer, into which the means for providing the current control and the gain control is integrated.

21. A non-transitory processor-readable storage medium comprising instructions that, when executed by a processor, cause the processor to:
during a calibration process:
initiate adjustment of a current applied to a controllable oscillator so that a tuning signal applied to the controllable oscillator is within a tuning range;
while the current is applied to the controllable oscillator, initiate application of at least two different reference signals to the controllable oscillator to determine a frequency difference of an output frequency of the controllable oscillator; and
initiate further adjustment of the current applied to the controllable oscillator in response to the frequency difference;
determine a gain of the controllable oscillator based on the frequency difference and a corresponding difference in the at least two different reference signals
initiate adjustment of the gain of the controllable oscillator to a target gain; and
further adjust the current while substantially maintaining the gain of the controllable oscillator at the target gain to calibrate the controllable oscillator to a particular frequency-voltage tuning range.

22. The non-transitory processor-readable medium of claim 21, further comprising instructions that, when executed by the processor, cause the processor to:
initiate a closed loop operating mode after the controllable oscillator is calibrated.

23. The non-transitory processor readable medium of claim 21, wherein the processor is integrated at least one of: a set top box, a music player, a video player, an entertainment unit, a navigation device, a communications device, a personal digital assistant (PDA), a fixed location data unit, or a computer.

* * * * *